US009490176B2

United States Patent
Chang et al.

(10) Patent No.: US 9,490,176 B2
(45) Date of Patent: Nov. 8, 2016

(54) METHOD AND STRUCTURE FOR FINFET ISOLATION

(71) Applicant: Taiwan Semiconductor Manufacturing Company, Ltd., Hsin-Chu (TW)

(72) Inventors: Che-Cheng Chang, Hsin-Chu (TW); Chih-Han Lin, Hsin-Chu (TW); Jr-Jung Lin, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/579,728

(22) Filed: Dec. 22, 2014

(65) Prior Publication Data

US 2016/0111336 A1    Apr. 21, 2016

Related U.S. Application Data

(60) Provisional application No. 62/065,125, filed on Oct. 17, 2014.

(51) Int. Cl.
*H01L 21/8234*  (2006.01)
*H01L 29/66*    (2006.01)
*H01L 27/088*   (2006.01)

(52) U.S. Cl.
CPC .......... *H01L 21/823481* (2013.01); *H01L 21/823431* (2013.01); *H01L 27/0886* (2013.01); *H01L 29/66545* (2013.01)

(58) Field of Classification Search
CPC ................................. H01L 21/823481
USPC ........................................ 257/401
See application file for complete search history.

(56) References Cited

U.S. PATENT DOCUMENTS

| 8,487,378 | B2 | 7/2013 | Goto et al. |
| 8,729,634 | B2 | 5/2014 | Shen et al. |
| 8,753,970 | B2 * | 6/2014 | Xie ............... H01L 29/66545 257/387 |
| 8,826,213 | B1 | 9/2014 | Ho et al. |
| 8,887,106 | B2 | 11/2014 | Ho et al. |
| 9,245,883 | B1 | 1/2016 | Lin et al. |
| 2014/0282326 | A1 | 9/2014 | Chen et al. |

* cited by examiner

*Primary Examiner* — Anthony Ho
(74) *Attorney, Agent, or Firm* — Haynes and Boone, LLP

(57) ABSTRACT

A semiconductor device with effective FinFET isolation and method of forming the same are disclosed. The method includes receiving a substrate having an active fin, a plurality of dummy gate stacks over the substrate and engaging the fin, and first dielectric features over the substrate and separating the dummy gate stacks. The method further includes removing the dummy gate stacks thereby forming a first trench and a second trench that expose first and second portions of the active fin respectively. The method further includes removing the first portion of the active fin and forming a gate stack in the second trench, the gate stack engaging the second portion of the active fin. The method further includes filling the first trench with a second dielectric material that effectively isolates the second portion of the active fin.

20 Claims, 18 Drawing Sheets

METHOD AND STRUCTURE FOR FINFET ISOLATION

This claims the benefit of U.S. Prov. No. 62/065,125 entitled "Method and Structure for FinFET Isolation," filed Oct. 17, 2014, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, double patterning lithography (DPL) is generally used in fin field effect transistor (FinFET) fabrication processes. A conventional DPL process uses two mask patterns, a mandrel pattern and a cut pattern that removes unwanted portions of the mandrel pattern, a derivative, or both. For example, the DPL process forms a fin using the mandrel pattern and then cuts the fin into two or more sections using the cut pattern. Each section of the fin is used for forming one or more FinFETs. Different sections of the fin must be properly isolated. A conventional fin isolation process uses another patterning process to form an isolation structure between two sections of the fin. Various issues arise from these conventional processes. For example, the fin cut process may undesirably over-etch or under-etch the fin due to etching critical dimension (CD) loading and/or etching depth loading problems. Fin over-etching would reduce process window for FinFET fabrication, such as source/drain contact landing, while fin under-etching would fail to create effective fin isolation. For another example, a fin cut patterning process and an isolation patterning process may not be properly aligned, resulting in both ineffective isolation and reduced process window for FinFET fabrication. Accordingly, what is needed is a method for effectively isolating the fins while providing sufficient CD and overlay process windows for FinFET fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
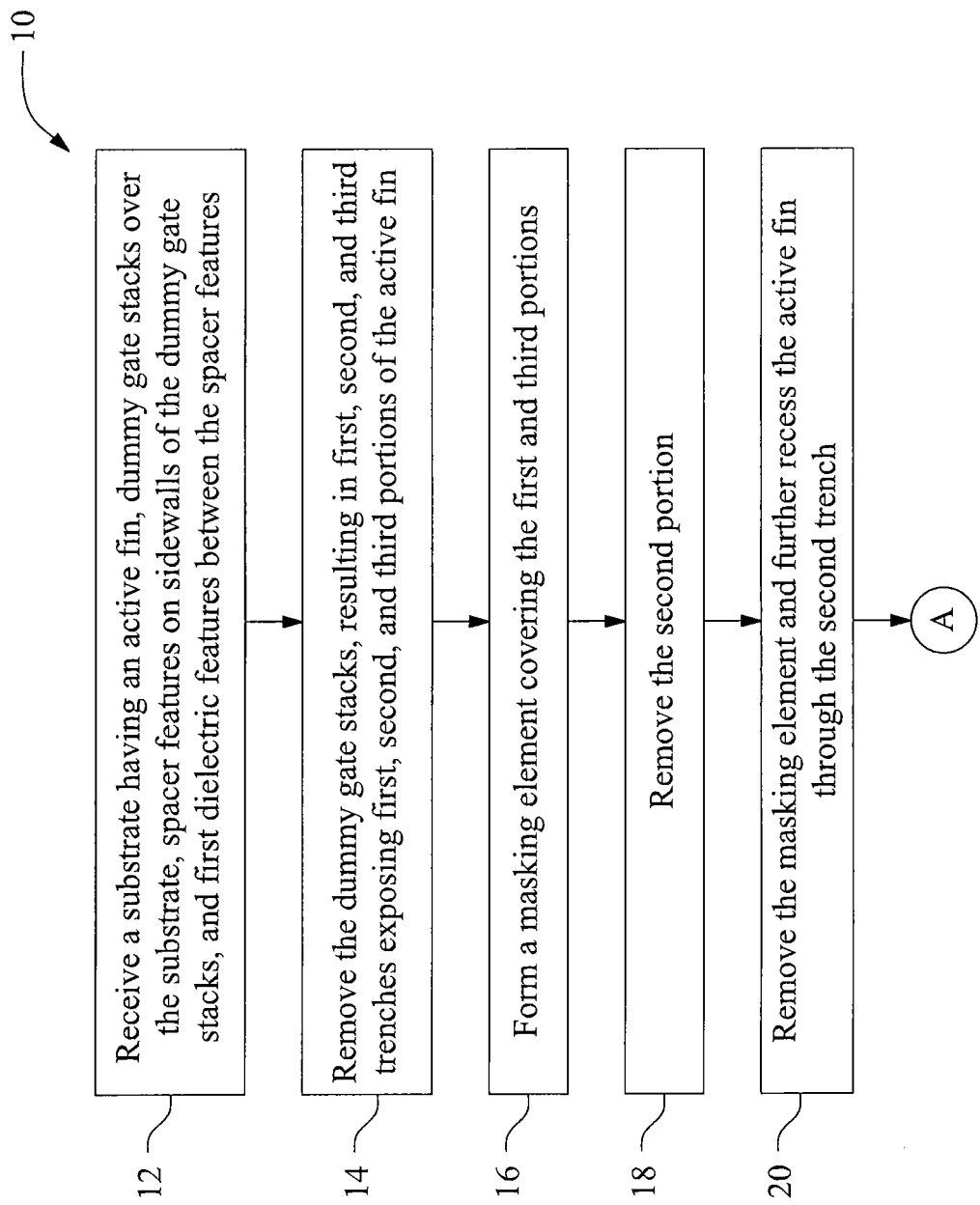
FIGS. 1A and 1B show a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having FinFETs. It is an objective of the present disclosure to provide methods and structures for effectively isolating fins while providing sufficient process windows for FinFET fabrication.

Figure 1B:
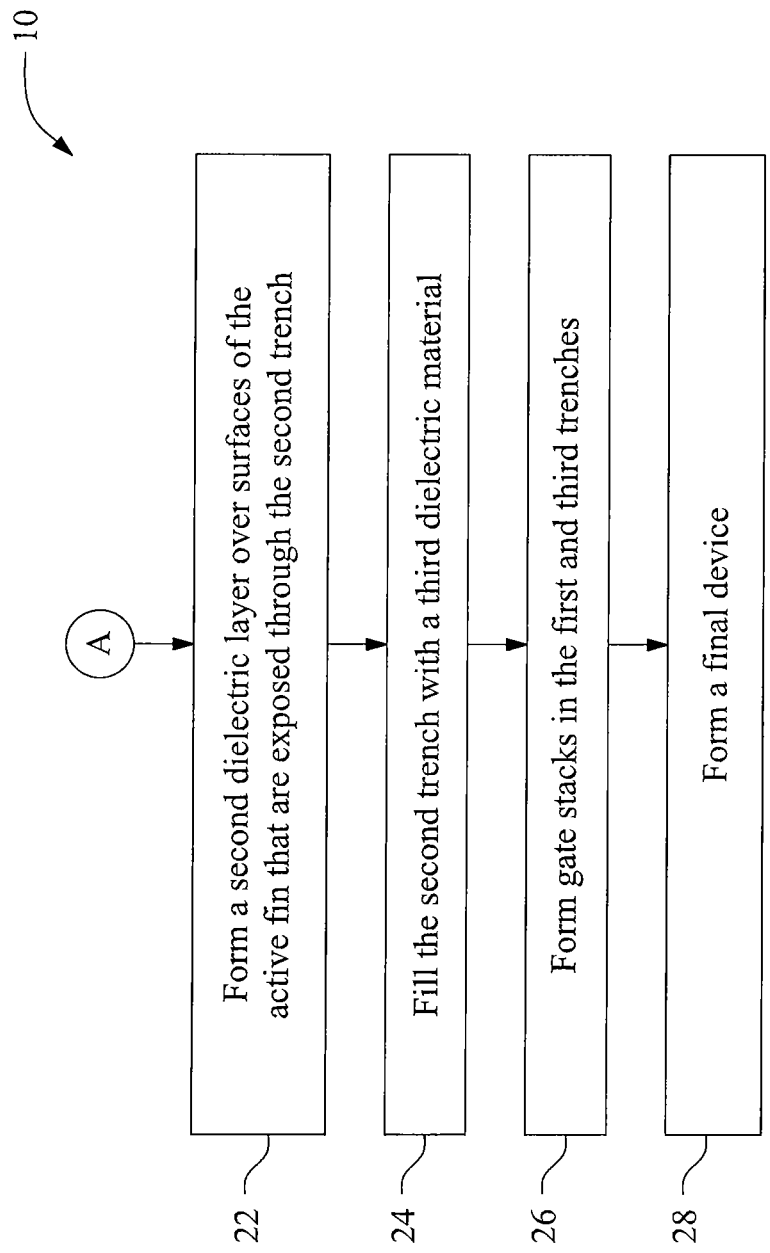

Referring now to FIGS. 1A and 1B, a flow chart of a method 10 of forming a semiconductor device is illustrated according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-9 that illustrate a portion of a semiconductor device 100 at various fabrication stages. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2A:
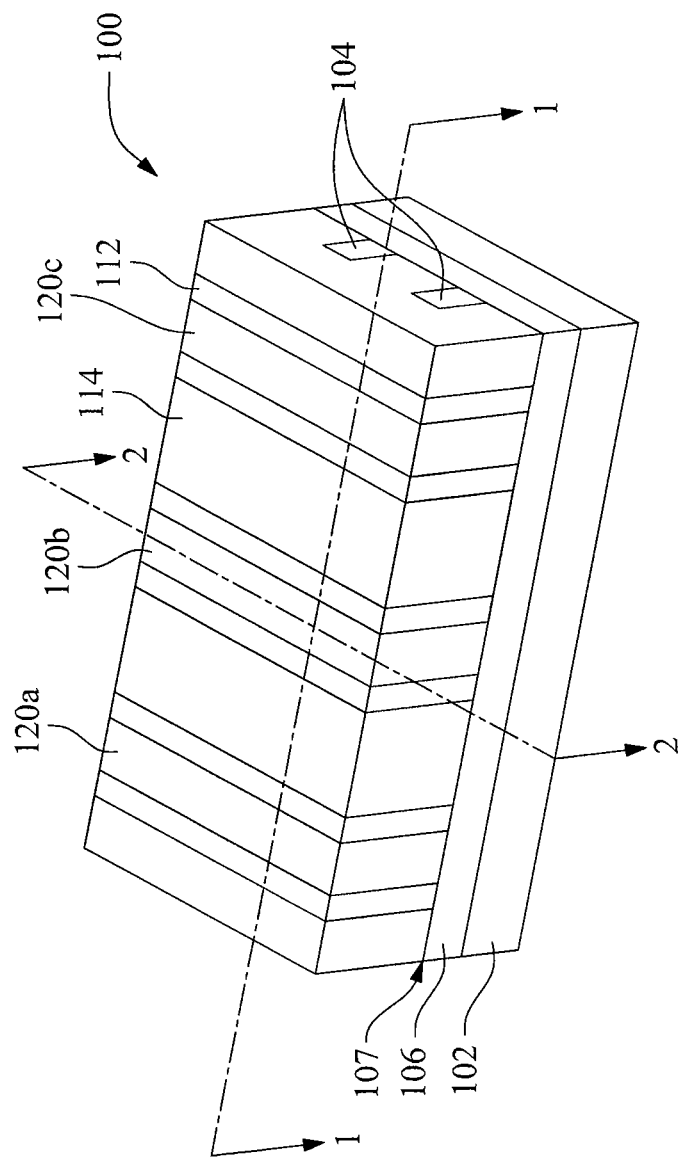
FIGS. 2A-9 are perspective and cross sectional views of forming a semiconductor device according to the method of FIGS. 1A and 1B, in accordance with some embodiments.
Figure 2B:
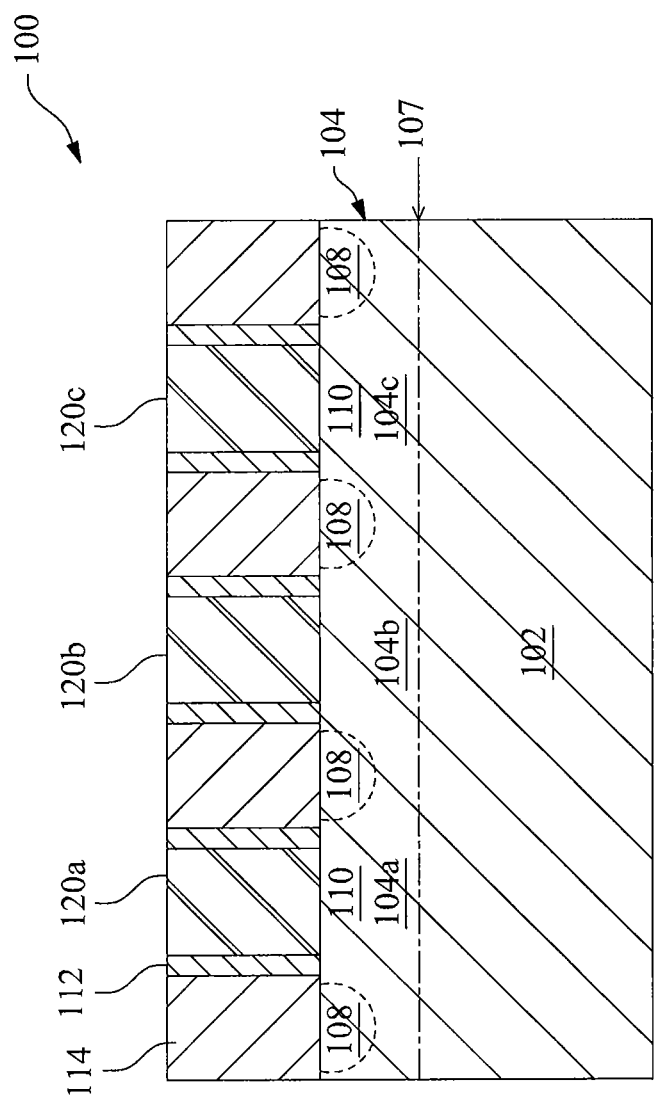
Figure 2C:
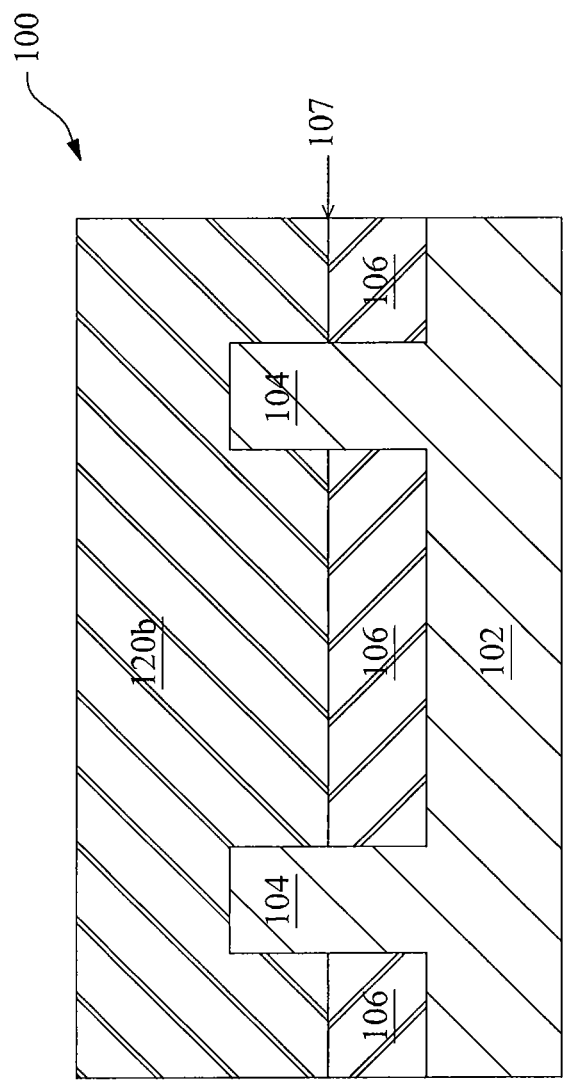

At operation 12, the method 10 (FIG. 1A) receives a substrate 102 with various structures formed therein and/or thereon. Refer to FIGS. 2A, 2B, and 2C collectively. FIG. 2A is a perspective schematic view of the semiconductor device 100, while FIGS. 2B and 2C are cross sectional views of the semiconductor device 100 along the "1-1" line and the "2-2" line of FIG. 2A respectively. The device 100 includes the substrate 102 which has two active fins 104. The fins 104 project upwardly from the substrate 102 and are oriented side by side longitudinally. The device 100 further includes an isolation structure 106 isolating the fins 104 laterally. The device 100 further includes a plurality of dummy gate stacks with three of them shown as dummy gate stacks 120a, 120b, and 120c. The dummy gate stacks 120a-c are formed over a surface 107 of the isolation structure 106, engaging the fins 104 along a width direction of the fins. The device 100 further includes spacer features 112 over sidewalls of the dummy gate stacks 120a-c, and first dielectric features 114 over the surface 107 and between the spacer features. Even though FIGS. 1A-1C show three dummy gate stacks over two fins, the present disclosure is not limited by specific configurations of the device 100. Embodiments of the present disclosure may include different types of devices, different number of devices, and/or different configuration of structures. The various aforementioned structures of the device 100 will be further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

The fins 104 are suitable for forming p-type FinFETs, n-type FinFETs, or both p-type FinFETs and n-type FinFETs in various embodiments. As shown in FIG. 2B, each fin 104 includes three portions (or sections), 104a, 104b, and 104c. The three dummy gate stacks 120a, 120b, and 120c engage the three portions 104a, 104b, and 104c respectively. Specifically, the dummy gate stacks 120a and 120c engage the fin portions 104a and 104c adjacent to channel regions 110 of the respective fin portions. FIG. 2B further shows source/drain (S/D) regions 108 disposed on both sides of the dummy gate stacks 120a and 120c, sandwiching the respective channel regions 110. It is notable that a channel region is not shown underneath the dummy gate stack 120b in the fin portion 104b. As will be explained later, the fin portion 104b will be removed and replaced with an isolation structure so as to isolate the fin portions 104a and 104c as well as the FinFETs formed thereon. The S/D regions 108 may include halo or lightly doped source/drain (LDD) implantation. In some embodiments, the S/D regions 108 may include raised source/drain regions, strained regions, epitaxially grown regions, and/or other suitable S/D features.

The fins 104 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 104 on the substrate 102. The etching process can include dry etching, wet etching, reactive ion etching (RIE), and/or other suitable processes. Alternatively, the fins 104 may be formed using mandrel-spacer double patterning lithography. Numerous other embodiments of methods to form the fins 104 may be suitable. The various features in the S/D regions 108 may be formed after the dummy gate stacks 120a-c and spacer features 112 have been formed, which will be discussed below.

The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fins 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The dummy gate stacks 120a-c engage the fins 104 on three sides of the fins in the present embodiment. Alternatively, they may engage the fins 104 on only two sides (not on top side) of the fins. They are termed "dummy" because they will be removed in a later step and will be replaced with a "real" gate stack or other suitable structure (e.g., an isolation structure). In the present embodiment, the dummy gate stacks 120a and 120c will be replaced with a high-k metal gate in a "gate-last" process, while the dummy gate stack 120b will be replaced with an isolation structure. The dummy gate stacks 120a-c may each include one or more material layers. For example, they may each include a dummy oxide layer and a dummy gate electrode. The dummy oxide layer may include a dielectric material such as silicon oxide ($SiO_2$) or nitrogen (N) doped $SiO_2$, and may be formed by chemical oxidation, thermal oxidation, atomic layer deposition (ALD), chemical vapor deposition (CVD), and/or other suitable methods. The dummy gate electrode may comprise a single layer or multilayer structure. In an embodiment, the dummy gate electrode comprises polysilicon. The dummy gate electrode may be formed by suitable deposition processes such as low-pressure chemical vapor deposition (LPCVD) and plasma-enhanced CVD (PECVD). In an embodiment, the dummy oxide layer and the dummy gate electrode are first deposited as blanket layers over the substrate 102. Then the blanket layers are patterned through a process including photolithography processes and etching processes thereby removing portions of the blanket layers and keeping the remaining portions over the substrate 102 as the dummy oxide layer and the dummy gate electrode. In some embodiments, the dummy gate stacks 120a-c may each include additional dielectric layers and/or conductive layers, such as hard mask layers, interfacial layers, capping layers, diffusion/barrier layers, other suitable layers, and/or combinations thereof.

The spacer features 112 are formed on vertical sidewalls of the dummy gate stacks 120a-c. The spacer features 112 include a material different from those of the dummy gate stacks. In an embodiment, the spacer features 112 include a dielectric material, such as silicon nitride or silicon oxynitride. In an example, the spacer features 112 each include multiple layers. In an embodiment, after the dummy gate stacks 120a-c have been formed, one or more spacer layers are formed by blanket depositing spacer materials over the device 100. Then, an anisotropic etching process is performed to remove portions of the spacer layers to form the spacer features 112 as illustrated in FIGS. 2A and 2B.

The first dielectric features 114 may include one or more dielectric layers. In an embodiment, the first dielectric features 114 each include an inter-layer dielectric (ILD)

layer over a contact etch stop layer (CESL). For example, the CESL may include a layer of silicon nitride, silicon oxide, silicon oxynitride, and/or other materials. The CESL may be formed by PECVD process and/or other suitable deposition or oxidation processes. The ILD layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the ILD layer may include a high density plasma (HDP) dielectric material (e.g., HDP oxide) and/or a high aspect ratio process (HARP) dielectric material (e.g., HARP oxide). The ILD layer may be deposited by a PECVD process or other suitable deposition technique. In an embodiment, the ILD layer is formed by a flowable CVD (FCVD) process. The FCVD process includes depositing a flowable material (such as a liquid compound) on the substrate 102 to fill the trenches between the dummy gate stacks 120a-c (with the spacer features 112 on sidewalls thereof) and converting the flowable material to a solid material by a suitable technique, such as annealing in one example. After various deposition processes, a chemical mechanical planarization (CMP) process is performed to planarize a top surface of the first dielectric features 114 and to expose a top surface of the dummy gate stacks 120a-c for subsequent fabrication steps.

Figure 3A:
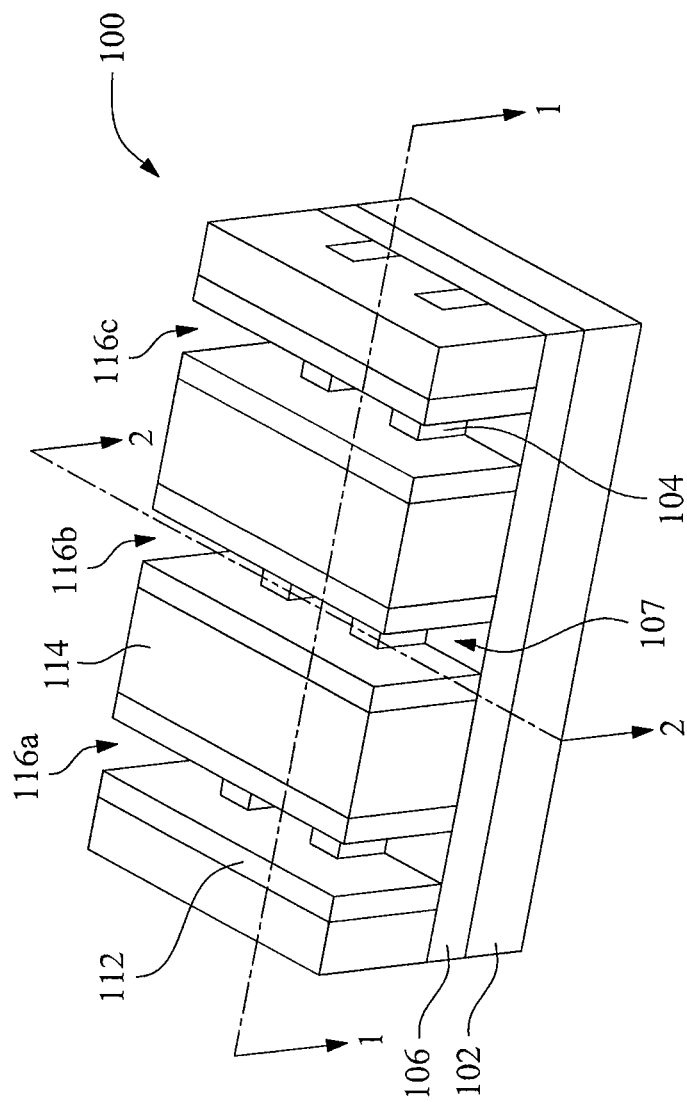
Figure 3B:
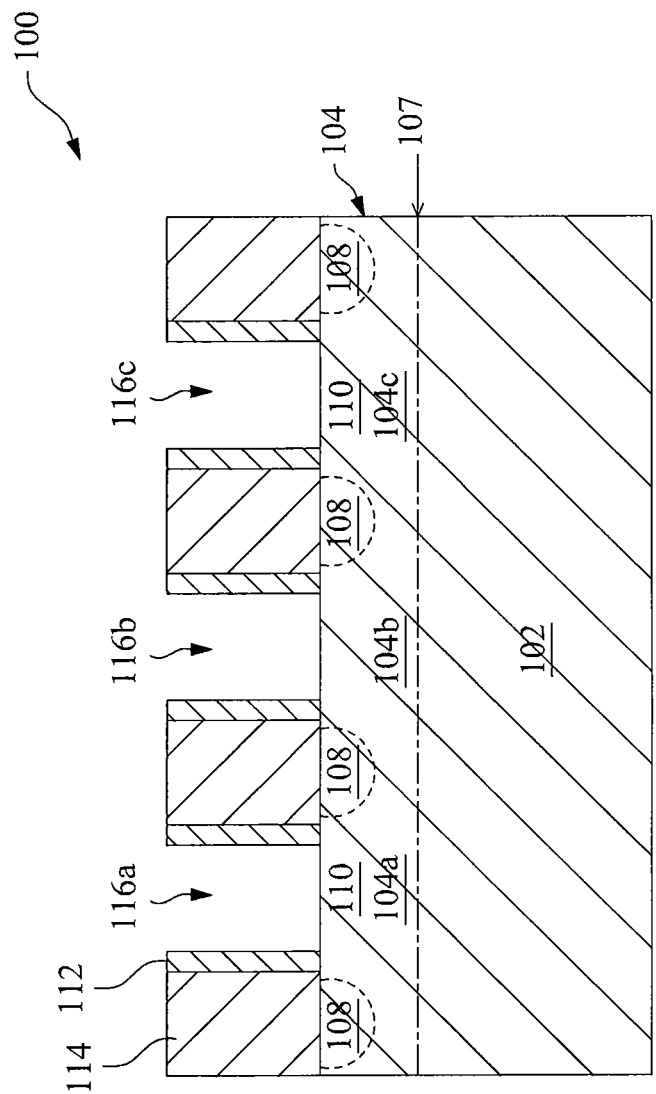
Figure 3C:
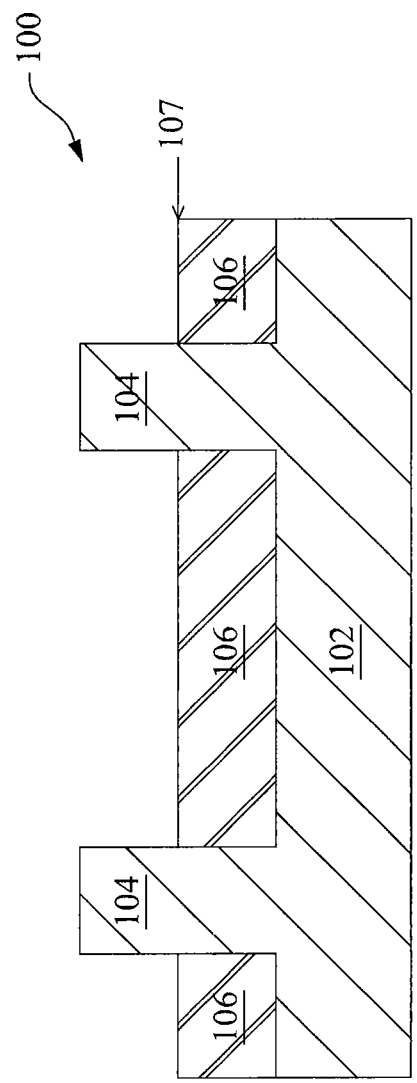

At operation 14, the method 10 (FIG. 1A) removes the dummy gate stacks 120a-c. Refer to FIGS. 3A, 3B, and 3C collectively. FIG. 3A is a perspective schematic view of the semiconductor device 100, while FIGS. 3B and 3C are cross sectional views of the semiconductor device 100 along the "1-1" line and the "2-2" line of FIG. 3A respectively. As shown in FIGS. 3A and 3B, the dummy gate stacks 120a-c are removed, resulting in three trenches 116a, 116b, and 116c. The three trenches 116a-c expose the fin portions 104a-c respectively. The dummy gate stacks 120a-c are removed by one or more etching processes that are selectively tuned to remove the materials therein while the spacer features 112 and the ILD layer 114 substantially remain. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid), TMAH (tetramethylammonium hydroxide), other suitable wet etching solutions, or combinations thereof.

Figure 4:
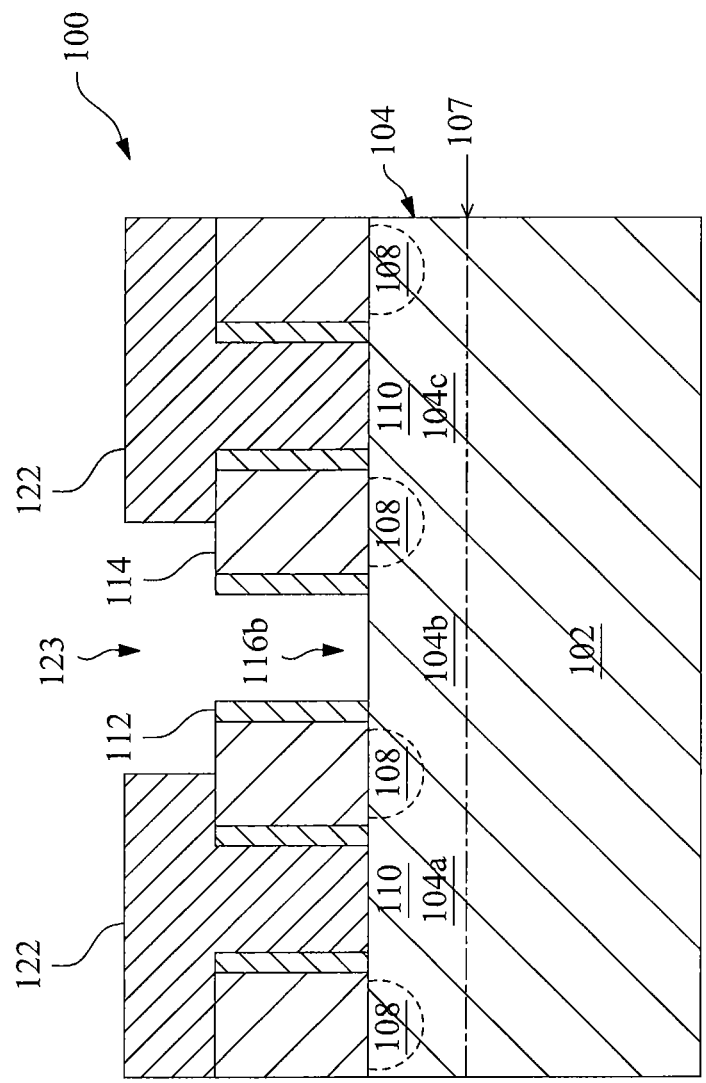

At operation 16, the method 10 (FIG. 1A) forms a masking element 122. Referring to FIG. 4, shown therein is a cross sectional view of the device 100 along the "1-1" line of FIG. 3A after operation 16. The masking element 122 covers the fin portions 104a and 104c. An opening 123 in the masking element 122 exposes the fin portion 104b through the trench 116b. In the present embodiment, the masking element 122 is a patterned photoresist (or resist) and is formed using a photolithography process. For example, the photolithography process may include forming a resist overlying the substrate 102 and covering the various structures on the substrate 102, exposing the resist to a pattern, performing post-exposure bake processes, and developing the resist to form the masking element 122. With respect to operation 16, the present disclosure provides advantages over conventional fin isolation methods. A conventional fin isolation process would first remove the fin portion 104b (e.g., using a fin cut process) and then form the dummy gate stack 120b (FIG. 2B) between the fin portions 104a and 104c as an isolation structure. In such a process, the fin cut process and the dummy gate stack formation process must be properly aligned, placing stringent constraints on fabrication processes such as narrow CD and overlay process windows. In contrast, the patterning process for the masking element 122 has much relaxed process windows. As shown in FIG. 4, the masking element 122 has a much wider process window to fully expose the fin portion 104b while covering fin portions 104a and 104c. The presence of the spacer features 112 and the first dielectric features 114 effectively enlarges both CD and overlay process windows for the masking element 122.

Figure 5A:
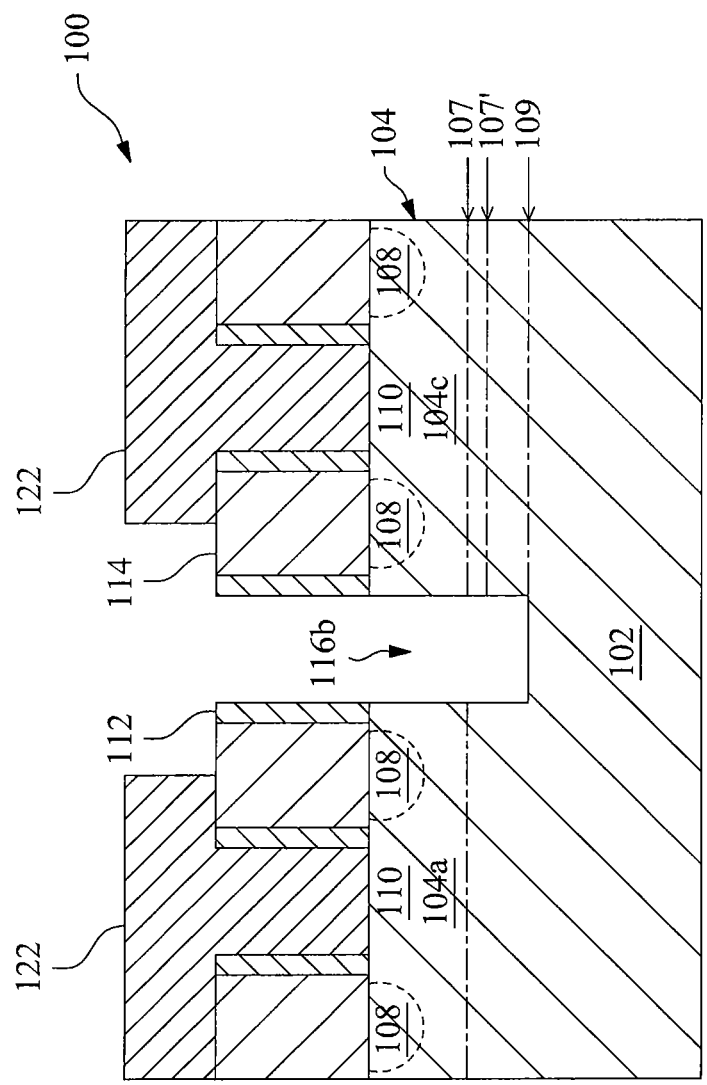
Figure 5B:
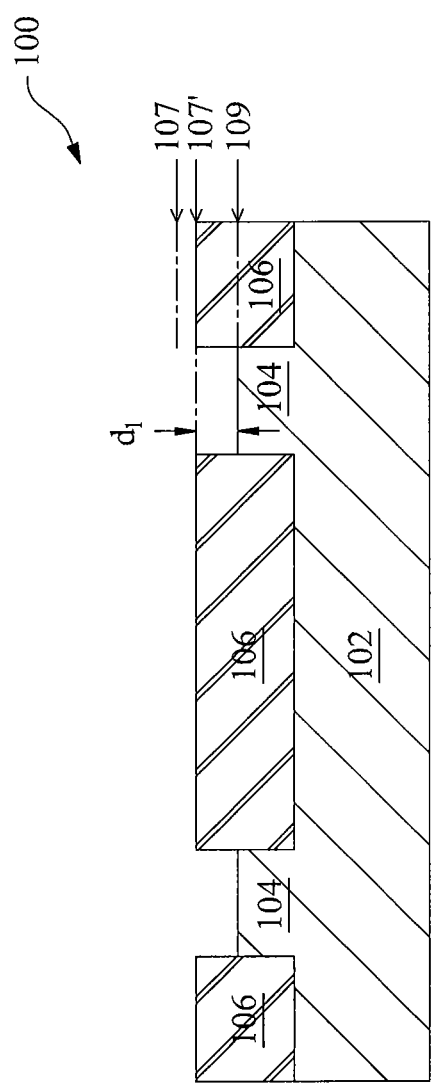

At operation 18, the method 10 (FIG. 1A) removes the fin portion 104b through the opening 123 and the trench 116b. Refer to FIGS. 5A and 5B collectively. FIG. 5A is a cross sectional view of the device 100 along the "1-1" line of FIG. 3A after operation 18. FIG. 5B is a cross sectional view of the device 100 along the "2-2" line of FIG. 3A after operation 18. The fin portion 104b is removed with an etching process where the masking element 122 acts as an etch mask. In an embodiment, the etching process is a dry (plasma) etching process. For example, the dry etching process may be performed under a source power of about 50 to about 1,500 W, a pressure of about 1 to about 100 mTorr, a temperature of about 20 to about 80 degrees Celsius, and using one or more of the gases $CF_4$, $CH_3F$, $O_2$, HBr, He, $Cl_2$, Ar, and $N_2$ as etching gas. In an embodiment, operation 18 not only removes the fin portions 104b, but also further recesses the fins 104 below the surface 107. In the present embodiment as shown in FIGS. 5A and 5B, both the isolation structure 106 and the fins 104 are recessed within the trench 116b. Specifically, the isolation structure 106 is recessed in the trench 116b to have another top surface 107' which is below the surface 107, while the fins 104 are recessed in the trench 116b to have a top surface 109 which is below the surface 107'. Therefore, operation 18 effectively expands the trench 116b below the surface 107. In embodiments, the recess from the surface 107 to the surface 107' may be slight or negligible. In the present embodiment, the surface 109 is below the surface 107' by a vertical distance $d_1$. In an embodiment, $d_1$ is about 50 to about 1000 Å. Although FIG. 5B shows that the surface 109 is still in the fins 104, in some embodiment, operation 18 may recess the trench 116b down into the substrate 102. In various embodiments, operation 18 is timer controlled based on a desired fin recess depth and an etching rate of the fin material. The masking element 122 may be partially consumed during the etching process.

Figure 6A:
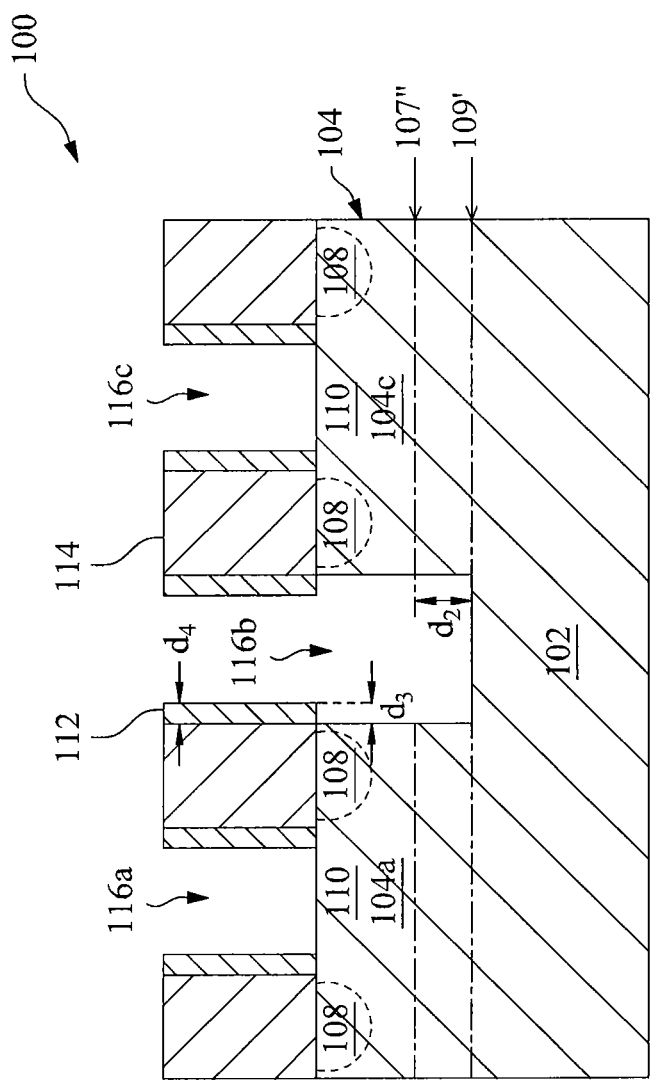
Figure 6B:
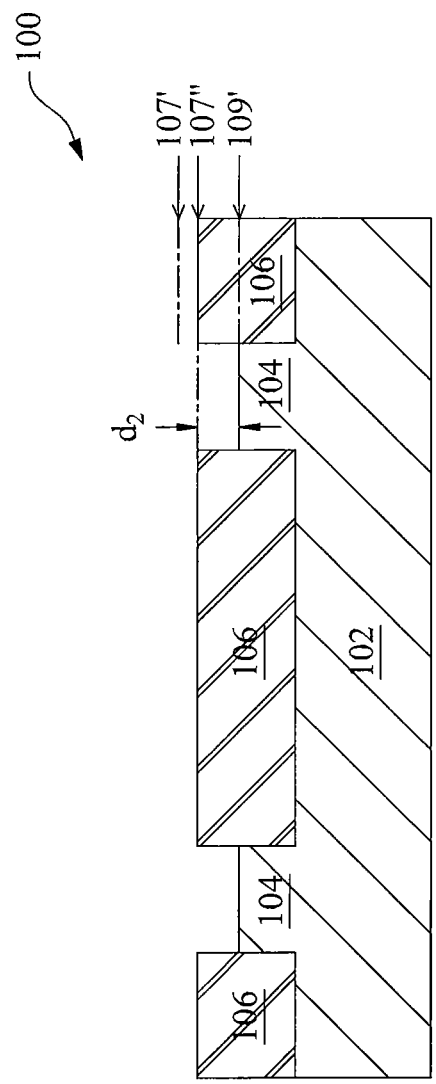

At operation 20, the method 10 (FIG. 1A) removes the masking element 122 and further recesses the fins 104. Refer to FIGS. 6A and 6B collectively. FIG. 6A is a cross sectional view of the device 100 along the "1-1" line of FIG. 3A after operation 20. FIG. 6B is a cross sectional view of the device 100 along the "2-2" line of FIG. 3A after operation 20. The masking element 122 is removed and the fin portions 104a and 104c are re-exposed through the trenches 116a and 116c. In an embodiment, operation 20 includes an ashing process, such as plasma ashing. In an example, the ashing process is performed at a temperature of about 20 to about 80 degrees Celsius and using one or more of the gases $H_2$, $O_2$, $N_2$, He, and Ar as etching gas. In an embodiment, operation 20 removes the masking element 122 and simultaneously further recesses the fins 104. In the embodiment shown in FIG. 6A, the fins 104 in the trench 116b are further recessed to have a top surface 109' that is below the top surface 109 (FIG. 5A). In various embodiments, a vertical distance between the surfaces 109 and 109' is about 20 to about 1000

Å. In an embodiment, the isolation structure 106 in the trench 116b is also further recessed to have a top surface 107" that is below the surface 107' (FIG. 5A). In embodiments, the recess from the surface 107' to the surface 107" may be slight or negligible. In an embodiment, a vertical distance between the surfaces 109' and 107", $d_2$, is about 50 to about 1000 Å. Furthermore, the fins 104 are also recessed a distance $d_3$ along their length direction towards both the fin portions 104a and 104c. In an embodiment, the distance $d_3$ is about 5 to about 100 Å. In various embodiments, operation 20 is timer controlled based on a desired fin recess depth (both downwards and laterally) and an etching rate of the fin material. A desired fin recess depth may be determined based on isolation constraints, original fin height (FIG. 2C), and a thickness of the spacer features 112. For example, one consideration is to provide sufficient contact landing areas in the S/D regions 108. In an embodiment, the spacer features 112 have a thickness $d_4$ which is about 5 to about 500 Å. When the distance $d_3$ exceeds $d_4$, the trench 116b eats into the contact landing areas in the S/D regions 108, which deserves consideration. In an embodiment, operation 20 is controlled so that $d_3$ does not exceed $d_4$, which provides maximum landing areas for S/D contact formation.

Figure 7:
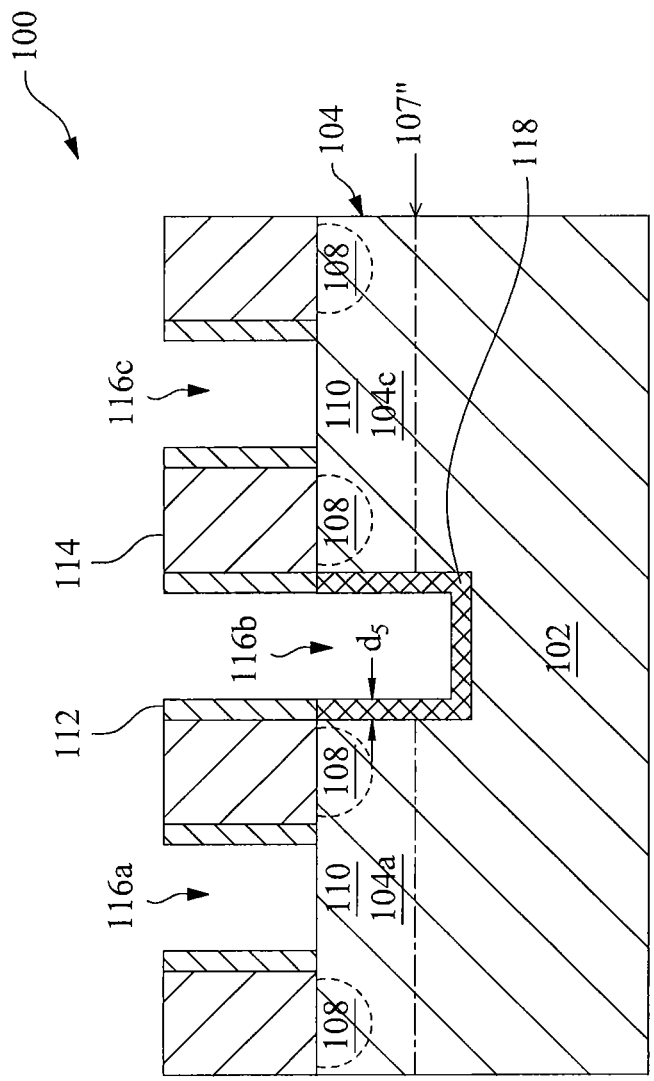

At operation 22, the method 10 (FIG. 1B) forms a dielectric layer 118 over surfaces of the active fins 104 that are exposed through the trench 116b. Referring to FIG. 7, shown therein is a cross sectional view of the device 100 along the "1-1" line of FIG. 3A after operation 22. The dielectric layer 118 is formed on all three sides of the active fins 104 in the trench 116b. In an embodiment, the dielectric layer 118 is an oxidation layer, such as silicon oxide. In another embodiment, the dielectric layer 118 is a nitridation layer, such as silicon nitride. In embodiments, operation 22 is performed under a source power of about 50 to about 1,500 W, a pressure of about 1 to about 80 mTorr, a temperature of about 20 to about 80 degrees Celsius, and using one or more of the gases $O_2$, He, Ar, and $N_2$ as reaction gas. In an embodiment, the dielectric layer 118 is formed to have a thickness $d_5$ which is about 5 to about 100 Å. In embodiments, the dielectric layer 118 further improves isolation between the fin portions 104a and 104c. In an embodiment of the method 10, operation 22 is optionally performed.

Figure 8:
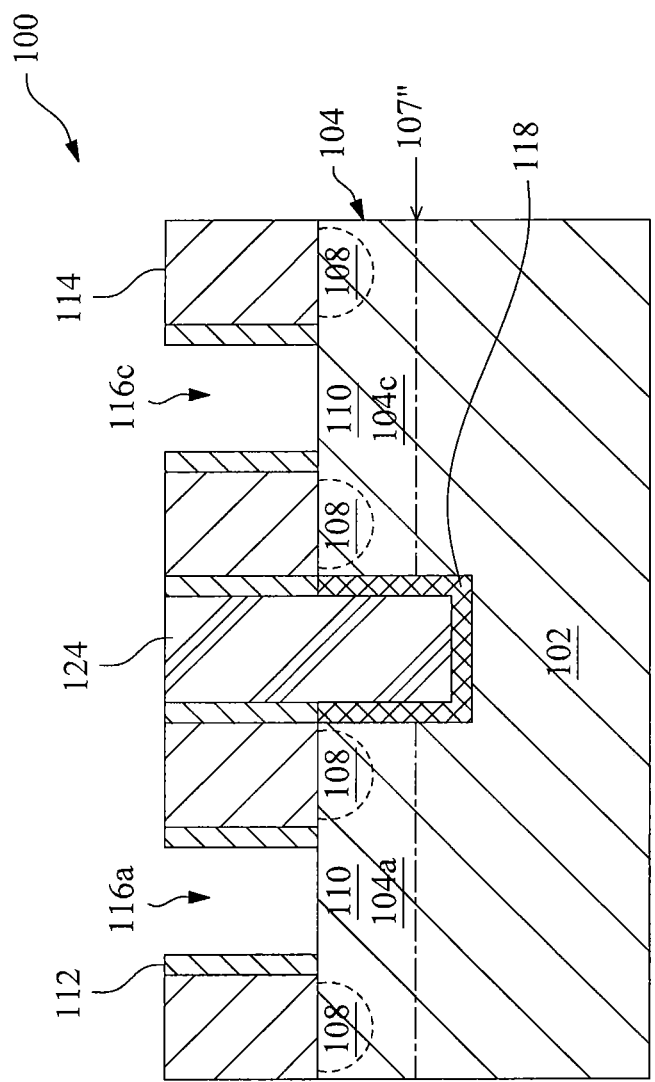

At operation 24, the method 10 (FIG. 1B) fills the trench 116b with a dielectric material 124. Referring to FIG. 8, shown therein is a cross sectional view of the device 100 along the "1-1" line of FIG. 3A after operation 24. In an embodiment, the dielectric material 124 is the same as the material for the first dielectric features 114. Alternatively, the dielectric material 124 is different from the material for the first dielectric features 114. In an embodiment, operation 24 involves multiple steps including patterning and deposition processes. For example, the patterning process forms a masking element covering the trenches 116a and 116c, similar to the process discussed with respect to operation 16. Then the deposition process fills the trench 116b with the dielectric material 124 using a PECVD, FCVD, or other suitable deposition techniques. Thereafter, the masking element is removed using a wet etching or plasma ashing process, thereby re-exposing the fin portions 104a and 104c through the trenches 116a and 116c. The dielectric material 124 isolates the fin portions 104a and 104c. Therefore, it is also called an isolation structure 124. As can be seen from the above discussion, the isolation structure 124 is formed using a self-alignment process whereby the initial dummy gate stack 120b (FIG. 2B) defines a location of the isolation structure 124. This reduces lithography and etching processes and solves process window (e.g., CD and overlay) issues associated with conventional fin isolation methods.

Figure 9:
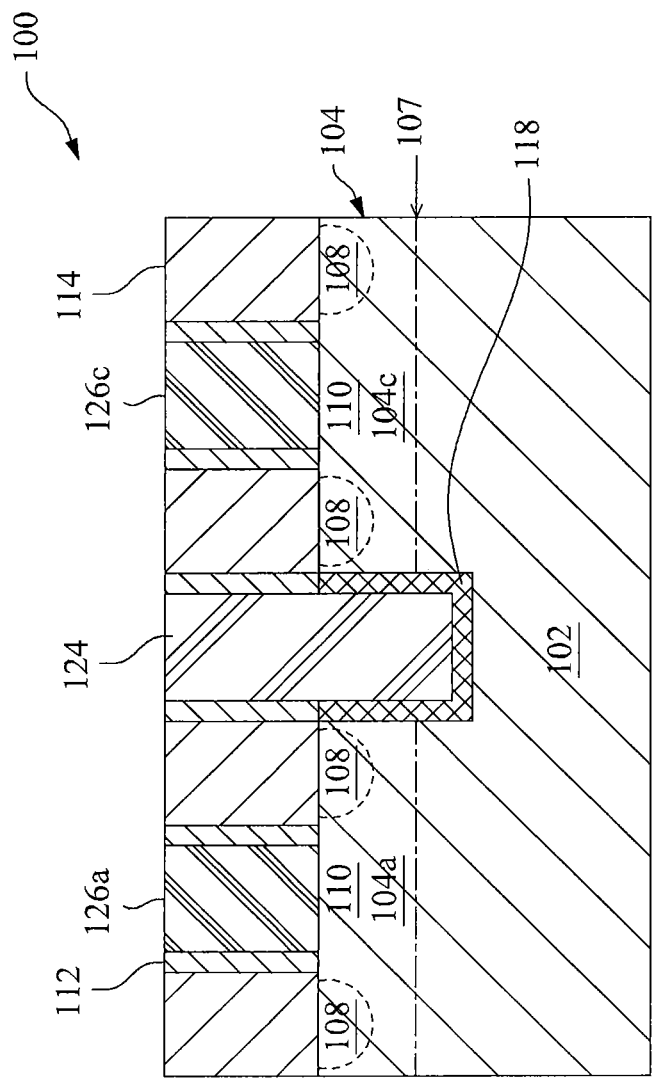

At operation 26, the method 10 (FIG. 1B) forms "real" gate stacks 126a and 126c in the trenches 116a and 116c respectively. Referring to FIG. 9, shown therein is a cross sectional view of the device 100 along the "1-1" line of FIG. 3A after operation 26. The gate stacks 126a and 126c engage the fin portions 104a and 104c adjacent to the respective channel regions 110. In an embodiment, each of the gate stacks 126a and 126c includes multiple layers of material. For example, it may include an interfacial layer, a dielectric layer, a work function metal layer, and a fill layer. The interfacial layer may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The dielectric layer may include a high-k dielectric layer such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The work function metal layer may be a p-type or an n-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers and may be deposited by CVD, PVD, and/or other suitable process. The fill layer may include aluminum (Al), tungsten (W), cobalt (Co), copper (Cu), and/or other suitable materials. The fill layer may be formed by CVD, PVD, plating, and/or other suitable processes. A CMP process may be performed to remove excess materials from the gate stacks 126a and 126c and to planarize a top surface of the device 100.

Still referring to FIG. 9, two FinFETs are thereby formed over the substrate 102. The first FinFET includes the fin portion 104a having the S/D regions 108 and the channel region 110 and further includes the gate stack 126a. The second FinFET includes the fin portion 104c having the S/D regions 108 and the channel region 110 and further includes the gate stack 126c. The fin portions 104a and 104c are separated by the isolation structure 124 and the dielectric layer 118. Top surfaces of the S/D regions 108 adjacent to the dielectric layer 118 can be controlled so as to provide sufficient landing area for S/D contact formation.

At operation 28, the method 10 (FIG. 1B) performs further operations to form a final device. For example, operation 28 may form contacts and vias electrically connecting the S/D regions 108 and the gate stacks 126 of the first and second FinFETs, and form metal interconnects connecting the first and second FinFETs to other portions of the device 100 to form a complete IC.

Figure 10:
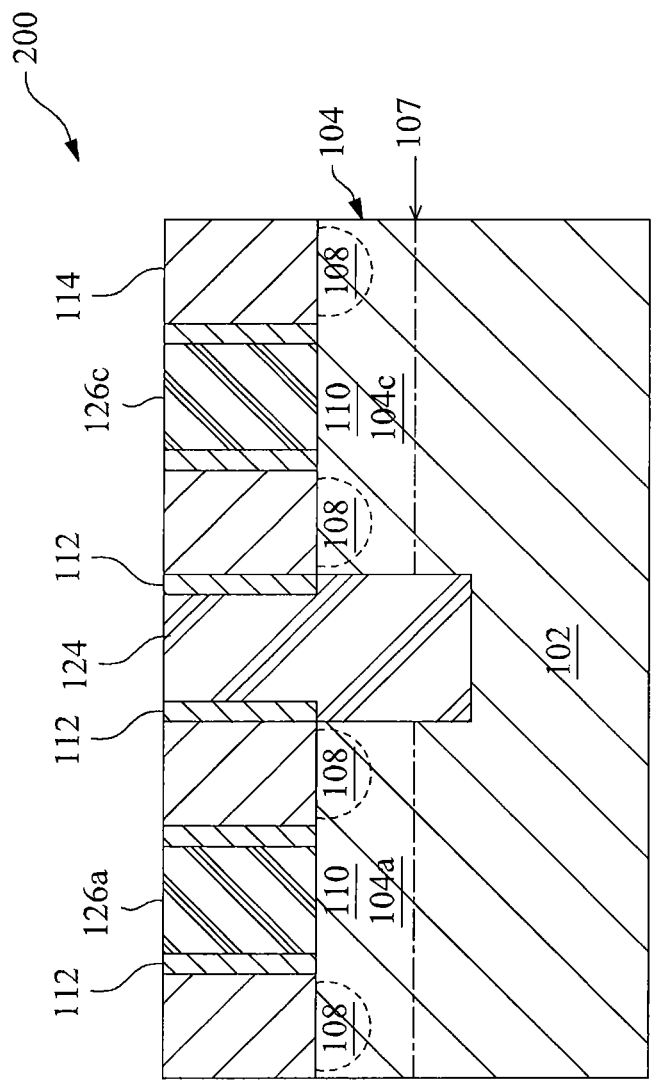
FIG. 10 is a cross sectional view of a semiconductor device fabricated using the method of FIGS. 1A and 1B, in accordance with some embodiments.

FIG. 10 illustrates a semiconductor device 200 fabricated using an embodiment of the method 10 where operation 22 is not performed. Referring to FIG. 10, the device 200 is the same as the device 100 (FIG. 9) except that the device 200 does not include the dielectric layer 118 between the fin portions 104a and 104c and the isolation structure 124. In various embodiments, the isolation structure 124 still provides sufficient isolation between the fin portions 104a and 104c.

Figure 11A:
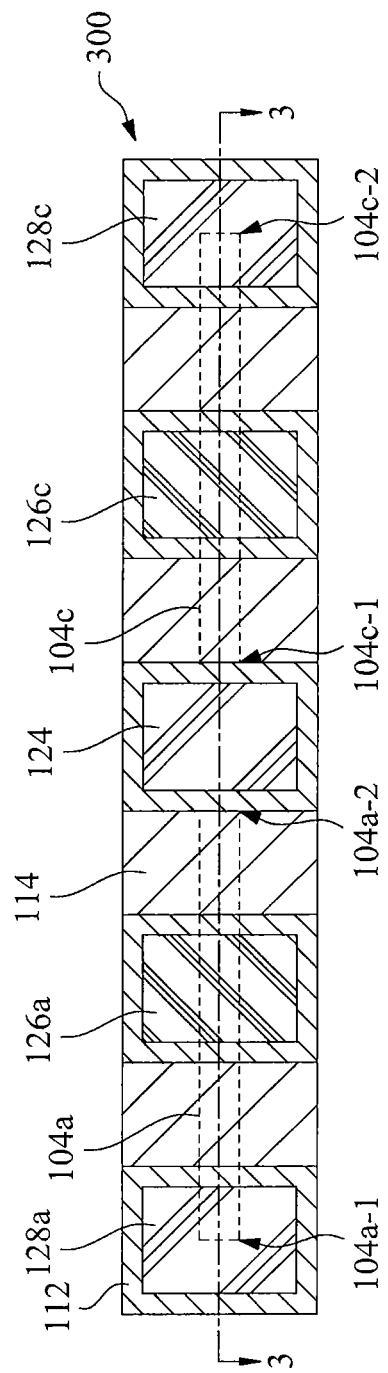
FIGS. 11A and 11B are top and cross sectional views of a semiconductor device fabricated using the method of FIGS. 1A and 1B, in accordance with some embodiments.
Figure 11B:
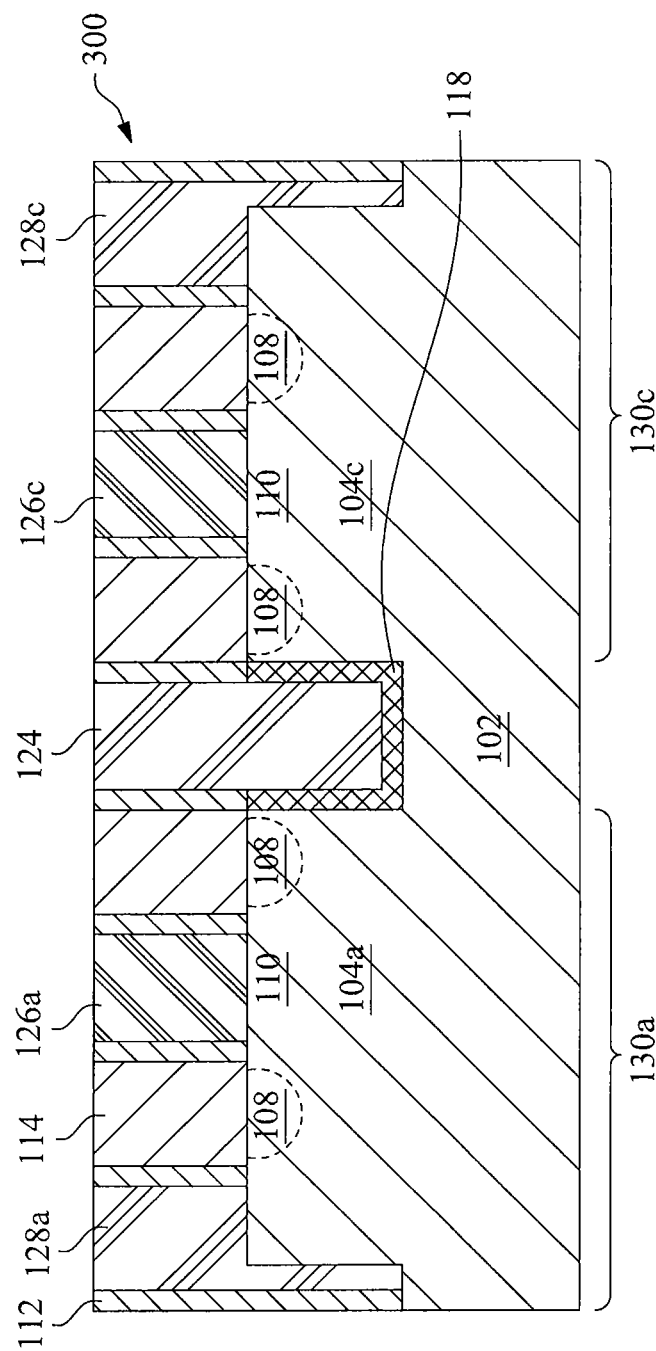

FIG. 11A shows a top view of a semiconductor device 300 fabricated using an embodiment of the method 10 (FIGS. 1A and 1B). FIG. 11B shows a cross sectional view of the device 300 along the "3-3" line of FIG. 11A. The device 300 has structures similar to those of the device 100, which are labeled with the same reference numerals for the sake of convenience. Referring to FIGS. 11A and 11B collectively, the device 300 includes a first FinFET 130a and a second FinFET 130c formed over a substrate 102. The FinFET 130a includes an active fin 104a having S/D regions 108 sandwiching a channel region 110 thereof. The FinFET 130c includes an active fin 104c having S/D regions 108 sandwiching a channel region 110 thereof. The fins 104a and 104c are oriented longitudinally along a common direction. The fin 104a has a first fin end 104a-1 and a second fin end 104a-2. The fin 104c has a first fin end 104c-1 and a second fin end 104c-2. The fin end 104a-2 is adjacent to the fin end 104c-1. In the present embodiment, the active fins 104a and 104c are two fin portions cut from a common active fin 104 using an embodiment of the method 10 (FIGS. 1A and 1B). The fins 104a and 104c, specifically the fin ends 104a-2 and 104c-1, are separated by an isolation structure 124. A dielectric layer 118 is located in between the isolation structure 124 and the fin ends 104a-2 and 104c-1. Furthermore, the fin ends 104a-1 and 104c-2 are covered underneath isolation structures 128a and 128c respectively. In an embodiment, the isolation structures 128a/c are formed using a process similar to that for the isolation structure 124. In another embodiment, the fin ends 104a-1 and 104c-2 are respective fin ends of the initial active fin 104 and the isolation structures 128a/c are simply dummy gate stacks, such as the dummy gate stack 120b (FIG. 2B). In yet another embodiment, the isolation structures 128a/c are formed using a process similar to that for the isolation structure 124 except that the fin ends 104a-1 and 104c-2 are not etched. In various embodiments, the isolation structures 124 and 128a/c may be of the same or different materials.

Still referring to FIGS. 11A and 11B, the FinFET 130a further includes a gate stack 126a engaging the active fin 104a adjacent to its channel region 110. The FinFET 130c further includes a gate stack 126c engaging the active fin 104c adjacent to its channel region 110. The gate stacks, 126a/c, and the isolation structures, 124/128, are each surrounded by spacer features 112 on their respective sidewalls. The device 300 further includes dielectric features 114 between the spacer features 112. Although not shown in FIGS. 11A and 11B, the device 300 further includes an isolation structure over the substrate 102, such as the isolation structure 106 in FIG. 2C, over which the various structures 112, 114, 124, 126a/c, and 128 are formed. This aspect of the device 300 is the same as the device 100.

Although not intended to be limiting, one or more embodiments of the present disclosure provide many benefits to a semiconductor device and the formation thereof. For example, embodiments of the present disclosure provide methods for effectively forming isolation between active fins while providing sufficient process window for FinFET fabrication. For example, embodiments of the present disclosure use a self-alignment process to form a fin isolation structure whereby an initial dummy gate stack defines a location for the fin isolation structure. This reduces lithography and etching processes and solves process window (e.g., CD and overlay) issues associated with conventional fin isolation methods. For example, various embodiments of the present disclosure can be easily integrated into existing FinFET fabrication flow.

In one exemplary aspect, the present disclosure is directed to a method of forming a semiconductor device. The method includes receiving a substrate having an active fin, a plurality of dummy gate stacks over the substrate and engaging the fin, and first dielectric features over the substrate and between the dummy gate stacks. The method further includes removing the dummy gate stacks thereby forming a first trench and a second trench, wherein the first and second trenches expose first and second portions of the active fin respectively. The method further includes removing the first portion of the active fin and forming a gate stack in the second trench. The gate stack engages the second portion of the active fin.

In another exemplary aspect, the present disclosure is directed to a method of forming a semiconductor device. The method includes receiving a substrate having an active fin, an isolation structure over the substrate, a plurality of dummy gate stacks over a first surface of the isolation structure and engaging the fin, spacer features over the first surface and on sidewalls of the dummy gate stacks, and first dielectric features over the first surface and between the spacer features. The method further includes removing the dummy gate stacks thereby forming first, second, and third trenches. The second trench is between the first and third trenches. The first, second, and third trenches expose first, second, and third portions of the active fin respectively. The method further includes removing the second portion of the active fin and forming gate stacks in the first and third trenches. The gate stacks engage the first and third portions of the active fin.

In another exemplary aspect, the present disclosure is directed to a semiconductor device. The semiconductor device includes a substrate having first and second active fins. Each of the first and second active fins has first and second ends. The second end of the first active fin is adjacent to the first end of the second active fin. The semiconductor device further includes a first gate stack over the substrate and engaging the first active fin and a second gate stack over the substrate and engaging the second active fin. The semiconductor device further includes a first isolation structure over the first end of the first active fin and a second isolation structure over the second end of the second active fin from a top view. The semiconductor device further includes a third isolation structure adjacent to both the second end of the first active fin and the first end of the second active fin from the top view.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
  receiving a substrate having an active fin, a plurality of dummy gate stacks over the substrate and engaging the fin, and first dielectric features over the substrate and between the dummy gate stacks;
  removing the dummy gate stacks thereby forming a first trench and a second trench, wherein the first and second trenches expose first and second portions of the active fin respectively;
  removing the first portion of the active fin; and forming a gate stack in the second trench, the gate stack engaging the second portion of the active fin.

2. The method of claim 1, wherein the dummy gate stacks and the first dielectric features are separated by spacer features.

3. The method of claim 1, further comprising:
filling the first trench with a second dielectric material.

4. The method of claim 1, wherein the dummy gate stacks are over a first surface of an isolation structure over the substrate, and the removing of the first portion of the active fin includes:
expanding the first trench below the first surface.

5. The method of claim 1, wherein the removing of the first portion of the active fin includes:
forming a masking element over the second portion of the active fin; and
performing an etching process to the first portion of the active fin.

6. The method of claim 1, further comprising, after the removing of the first portion of the active fin:
performing an ashing process to the first trench so as to recess the active fin along its length.

7. The method of claim 6, wherein:
the dummy gate stacks and the first dielectric features are separated by spacer features having a first thickness; and
the ashing process recesses the active fin by a distance less than the first thickness.

8. The method of claim 6, wherein the ashing process exposes a first surface of the active fin, further comprising:
forming a second dielectric layer over the first surface.

9. The method of claim 8, wherein the second dielectric layer includes one of: silicon oxide and silicon nitride.

10. The method of claim 1, wherein the gate stack includes a high-k dielectric layer and a work function metal layer.

11. A method of forming a semiconductor device, comprising:
receiving a substrate having an active fin, an isolation structure over the substrate, a plurality of dummy gate stacks over a first surface of the isolation structure and engaging the fin, spacer features over the first surface and on sidewalls of the dummy gate stacks, and first dielectric features over the first surface and between the spacer features;
removing the dummy gate stacks thereby forming first, second, and third trenches, wherein the second trench is between the first and third trenches, and the first, second, and third trenches expose first, second, and third portions of the active fin respectively;
removing the second portion of the active fin; and
forming gate stacks in the first and third trenches, the gate stacks engaging the first and third portions of the active fin.

12. The method of claim 11, wherein the removing of the second portion of the active fin includes:
forming a masking element covering the first and third portions of the active fin; and
etching the second portion of the active fin below the first surface.

13. The method of claim 12, further comprising:
performing an ashing process to both remove the masking element and to recess the active fin through the second trench.

14. The method of claim 11, further comprising, after the removing of the second portion of the active fin:
performing one of oxidation and nitridation processes to surfaces of the active fin that are exposed through the second trench.

15. The method of claim 11, further comprising:
filling the second trench with a second dielectric material.

16. A method of forming a semiconductor device, comprising:
receiving a substrate having first and second active fins, wherein each of the first and second active fins has first and second ends, and the second end of the first active fin is adjacent to the first end of the second active fin;
forming a first gate stack over the substrate and engaging the first active fin;
forming a second gate stack over the substrate and engaging the second active fin;
forming a first isolation structure over the first end of the first active fin from a top view;
forming a second isolation structure over the second end of the second active fin from the top view; and
forming a third isolation structure adjacent to both the second end of the first active fin and the first end of the second active fin from the top view.

17. The method of claim 16, wherein each of the first, second, and third isolation structures is surrounded by respective spacer features.

18. The method of claim 16, further comprising:
forming a fourth isolation structure over the substrate, wherein the first and second gate stacks are formed over the fourth isolation structure.

19. The method of claim 18, wherein:
the first and second gate stacks are formed over a first surface of the fourth isolation structure; and
the third isolation structure is formed over a second surface of the fourth isolation structure, wherein the second surface is lower than the first surface from a cross sectional view.

20. The method of claim 16, wherein the second end of the first active fin and the first end of the second active fin each include a dielectric material layer abutting the third isolation structure, and the dielectric material layer is one of: silicon oxide and silicon nitride.

* * * * *